United States Patent [19]

Hozumi

[11] Patent Number: 5,013,677
[45] Date of Patent: May 7, 1991

[54] METHOD FOR MANUFACTURE OF SEMICONDUCTOR DEVICE

[75] Inventor: Hiroki Hozumi, Kanagawa, Japan

[73] Assignee: Sony Corporation, Tokyo, Japan

[21] Appl. No.: 538,727

[22] Filed: Jun. 18, 1990

[30] Foreign Application Priority Data

Jun. 19, 1989 [JP] Japan .................................. 1-156434

[51] Int. Cl.⁵ .......................................... H01L 21/265
[52] U.S. Cl. ......................................... 437/47; 437/46;
    437/60; 437/31; 437/917; 437/918; 437/162
[58] Field of Search ................... 437/47, 60, 917, 918,
    437/46, 162, 31

[56] References Cited

U.S. PATENT DOCUMENTS

| | | | |
|---|---|---|---|
| 4,497,106 | 5/1985 | Momma et al. | 437/162 |
| 4,839,302 | 6/1989 | Kameyama et al. | 437/31 |
| 4,851,362 | 7/1989 | Suzuki | 437/917 |
| 4,866,000 | 9/1989 | Okita | 437/31 |
| 4,946,798 | 8/1990 | Kawakatsu | 437/162 |

FOREIGN PATENT DOCUMENTS

0020534  2/1985  Japan ...................................... 437/46

Primary Examiner—Brian E. Hearn
Assistant Examiner—Kevin Picardat
Attorney, Agent, or Firm—Hill, Van Santen, Steadman & Simpson

[57] ABSTRACT

A method for the manufacture of a semiconductor device, comprising the steps of forming ohmic contact portions at the same time, then forming a semiconductor layer on the entire surface including the open portions, and selectively introducing impurities by ion implantation into the contact portions of the semiconductor layer and isolated other element regions, thereby producing a transistor and other elements. This method results in the simultaneous production of a transistor and other elements and simplifies the steps of the process of manufacture.

2 Claims, 11 Drawing Sheets

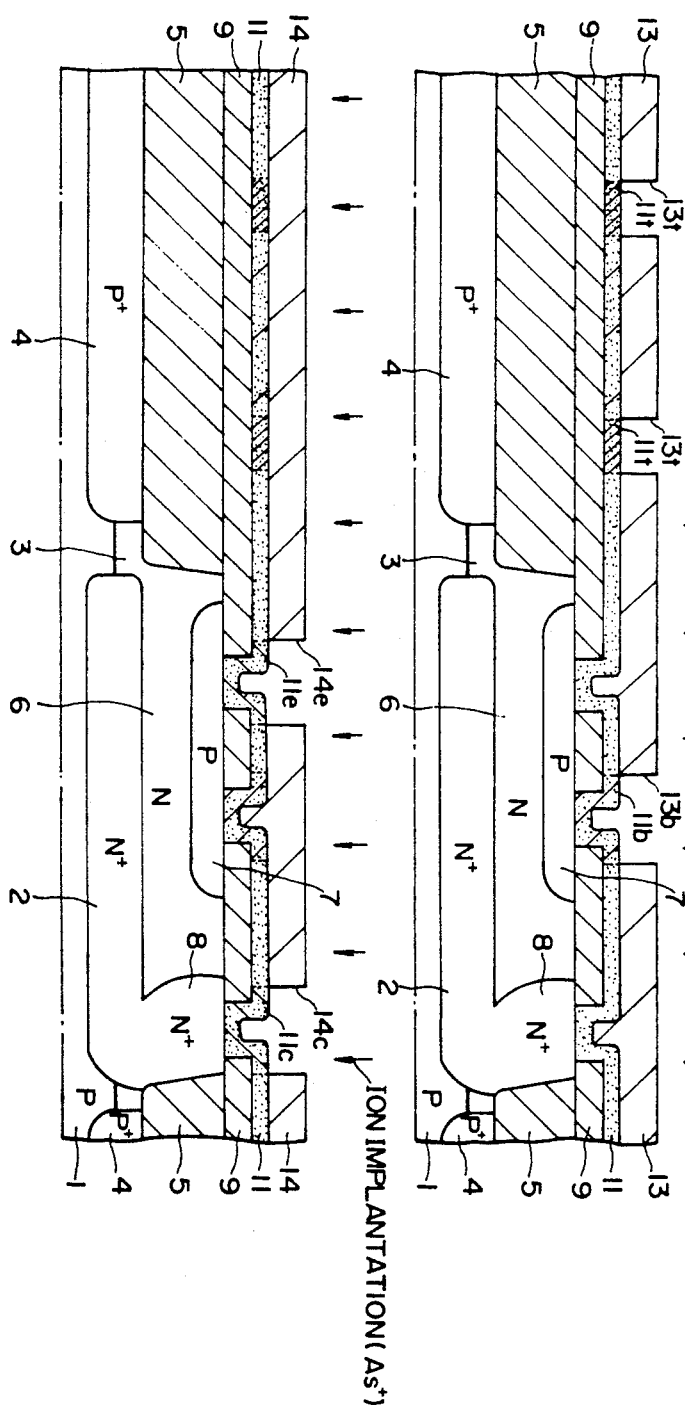

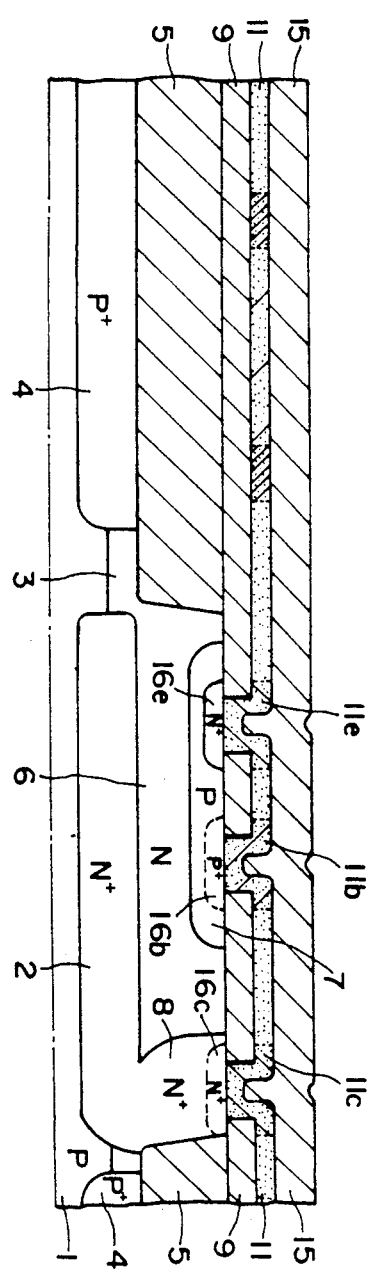
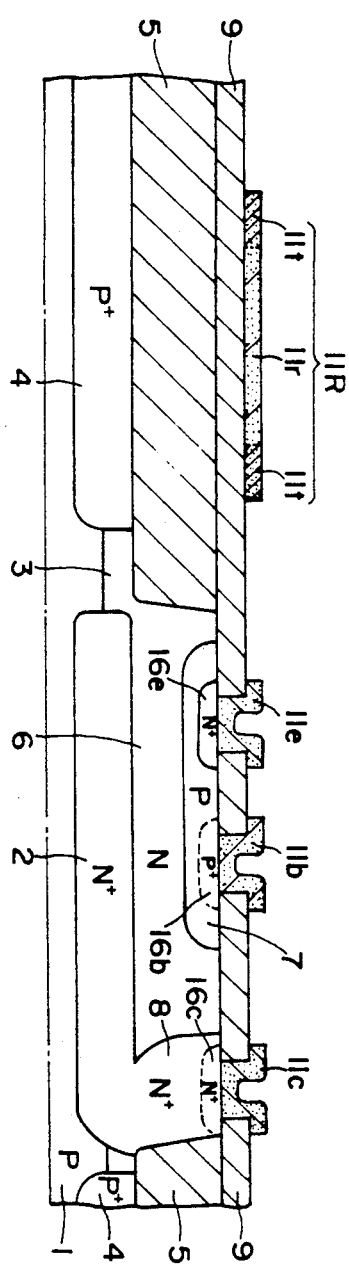
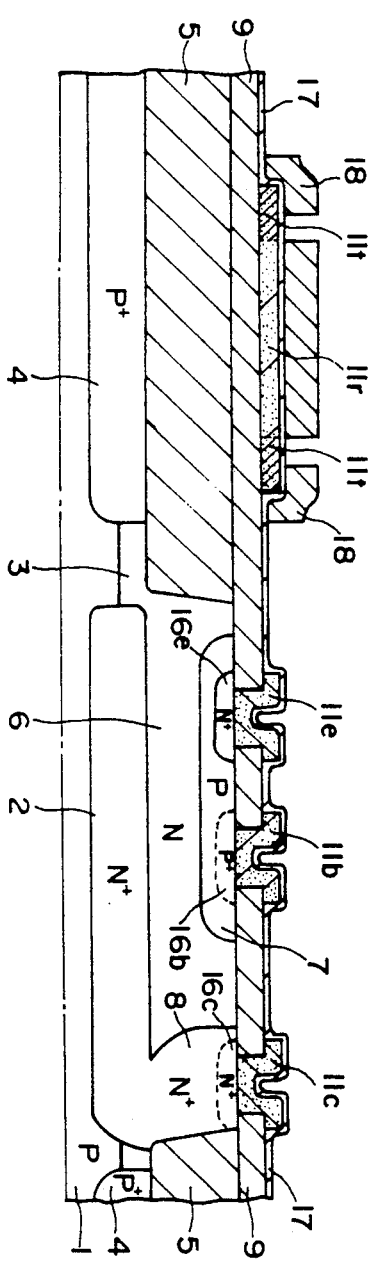

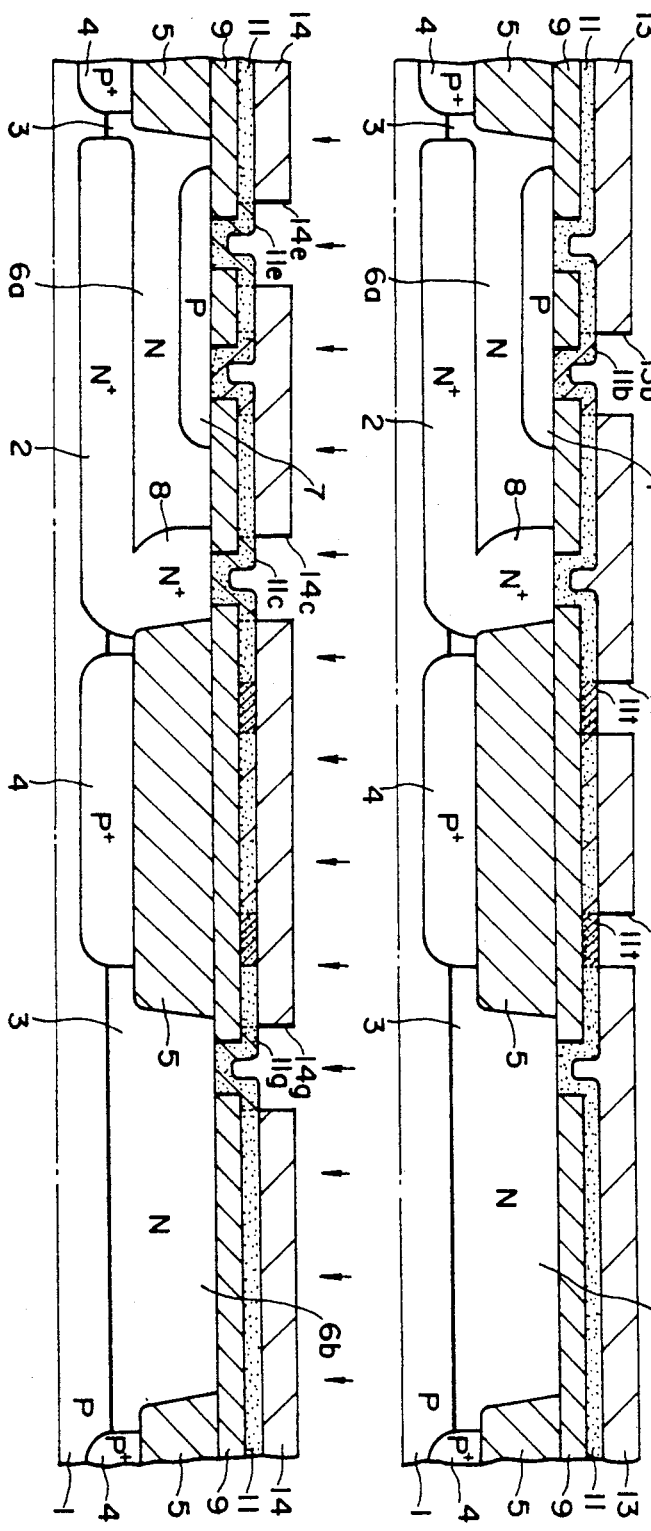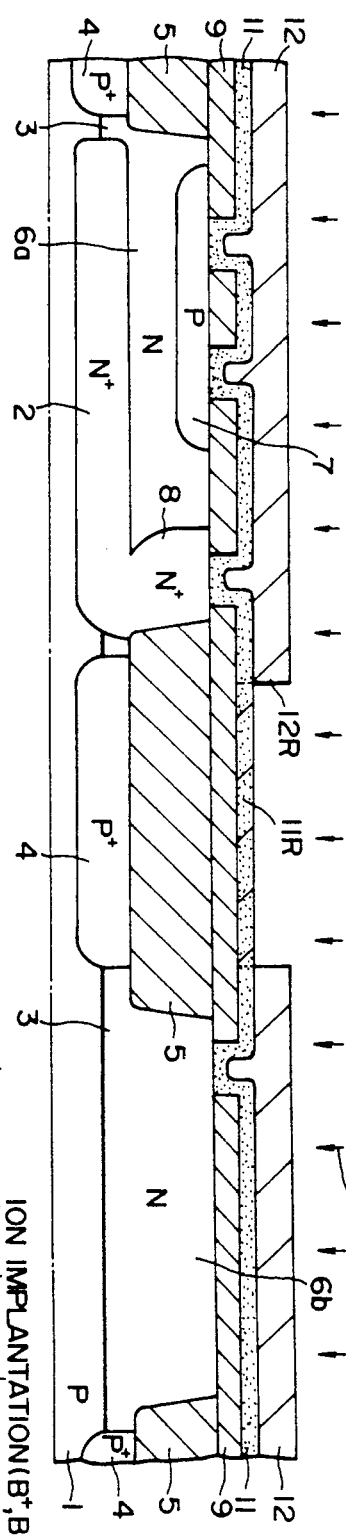

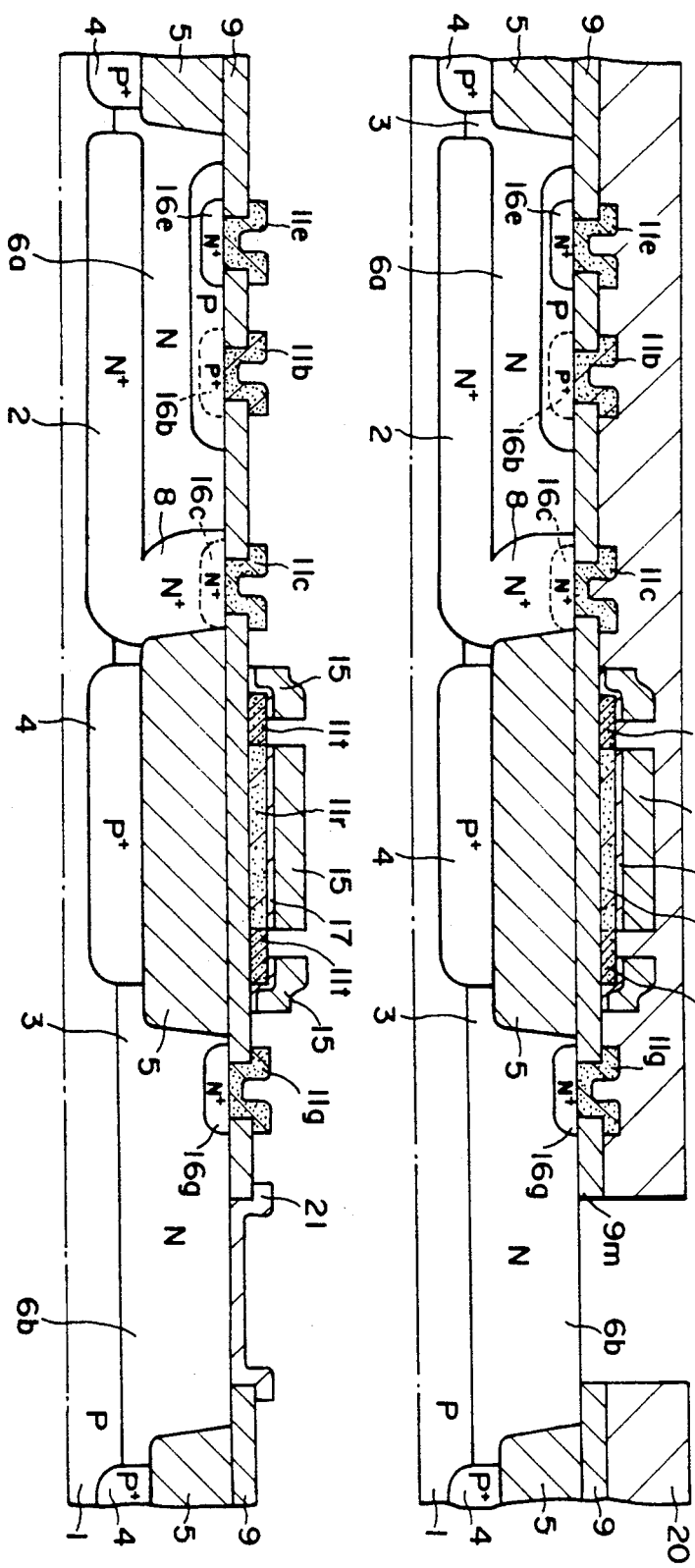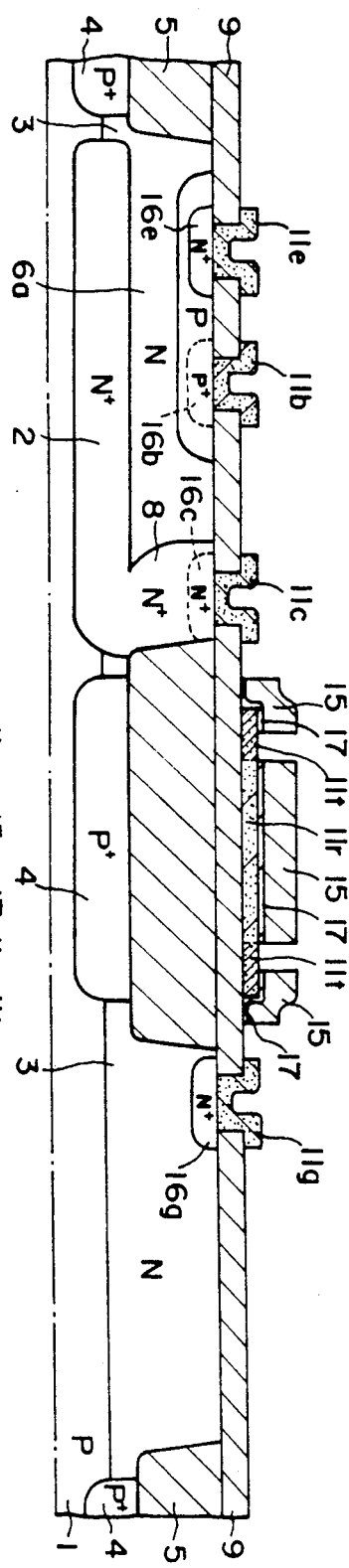
FIG. 2J
FIG. 2K
FIG. 2L

METHOD FOR MANUFACTURE OF SEMICONDUCTOR DEVICE

BACKGROUND OF THE INVENTION

1. Field of the Invention

The present invention relates in general to a method of manufacturing a semiconductor device and, more particularly, to a method which is adapted to produce a composite device of a transistor and other elements.

2. Description of Related Art

In the conventional bipolar transistor manufacturing methods previously known, it has generally been customary to adopt procedures which comprise the steps of first forming a buried layer and an N-type epitaxial layer, then double-diffusing impurities of first and second conduction types selectively into an active region which is surrounded by isolated inter-element regions, thereby forming a base region and an emitter region.

The latest developments of process technology have given rise to requirements for realizing higher integration densities and higher operation speeds of the elements. For the purpose of meeting such requirements, it is usual to employ a polycrystal silicon washed emitter (hereinafter referred simply to as poly-washed emitter) structure. The use of such poly-washed emitter structure makes it possible to form a self-matched emitter region. Such structure contributes to the reduction in size of an emitter opening (which results in the reduction of the cell size), and also to the decrease of base broadening resistance Rbb' which consequently results in advantages which allow obtaining higher integration density and higher operation speeds of the elements.

FIGS. 3A-3F illustrate a more specific description of a method for the manufacture of a bipolar transistor which has a poly-washed emitter structure. First, as shown in FIG. 3-A, an N-type buried layer 32 and an N-type epitaxial layer 33 are formed on a P-type semiconductor substrate 31. Then a P-type isolated inter-element region 34 and another isolated inter-element region 35 composed of a thick thermal oxide layer are formed. Then a P-type impurity is selectively ion-implanted into an active region 36 which is surrounded by isolated inter-element regions 34 and 35 to thereby form a base region 37. An N-type impurity is ion-implanted into a portion where a collector contact is to be formed, thereby forming a collector lead region 38 which extends up to the buried layer 32. Subsequently a silicon dioxide film 39 is formed by CVD (chemical vapor deposition) or the like on the entire surface inclusive of the active region 36.

Thereafter, as shown in FIG. 3-B, the silicon dioxide film 39 is selectively etched through a resist mask 40 so as to form open windows 39e and 39c in the portions corresponding to the emitter region (which will serve also as an emitter contact) and the collector contact of the active region 3 6.

In the next step, as shown in FIG. 3-C, the resist mask 40 on the silicon dioxide film 39 is removed, and a polycrystal silicon layer 41 is formed on the silicon dioxide film 39 including the windows 39e and 39c. Thereafter an N-type impurity (e.g. As+) is ion-implanted into the polycrystal silicon layer 41, and a heat treatment is performed so as to diffuse the N-type impurity from the polycrystal silicon layer 41, thereby forming an emitter region 42e (which serves also as an emitter contact) and a collector contact 42c (which is represented by a broken line) in a self-matched state.

Subsequently, as shown in FIG. 3-D, the polycrystal silicon layer 41 is patterned.

In the next step, as shown in FIG. 3-E, a resist mask 43 is formed on the polycrystal silicon layer 41 and the silicon dioxide film 39, and then the silicon dioxide film 39 is etched through the resist mask 43 so as to form a window 39b at a position which corresponds to the base contact.

Subsequently, as shown in FIG. 3-F, an aluminum layer is formed on the entire surface after removal of the resist film 43, and such aluminum layer is patterned so as to form an emitter electrode 44e which is connected to the emitter region 42e through the polycrystal silicon layer 41, a base electrode 44b which is connected to the base region 37, and a collector electrode 44c which is connected to the collector contact 42c through the polycrystal silicon layer 41, and a desired bipolar transistor is thus produced.

However, according to the conventional method of manufacturing a bipolar transistor, the step of forming the windows 39e and 39c which are opposed to the emitter region 42e and the collector contact 42c is different from the step of forming the window 39b which is opposed to the base region 37, and thus a total of two resist masks (denoted by 40 and 43 in FIG. 3) are required for opening the windows. Particularly when forming a composite device of a transistor, a resistor, a capacitor and so forth, a window opening resist mask is required for forming each element and consequently this makes the window opening step complicated. Also for ion implantation, generally resist masks are required in conformity with the individual conduction types of the impurities, so that a multiplicity of resist masks are required for forming elements and these are additional to the aforementioned window-opening resist masks, and thus the manufacture of a composite device becomes complicated.

It has been recently observed that, as faster operation and higher frequency band in the linear technical field for public use (including analog IC<analog LSI, etc.) have been developed that there are some devices which utilize the poly-washed emitter type in the general linear process as well. For the purpose of improving the noise and frequency characteristics, it is desired that a MIS capacitor be employed as a filter. However, since a composite device is produced by a combination of different steps for the individual elements as described, the steps become complicated and harmful influences occur due to heat treatment and so forth when forming other elements which consequently causes a deterioration in the precision of the capacitance control, thereby causing additional difficulties during manufacture (including the simultaneous production of a MIS capacitor for a transistor of a poly-washed emitter structure).

OBJECTS AND SUMMARY OF THE INVENTION

It is an object of the present invention to solve the problems described. One object is to provide an improved semiconductor device manufacturing method which is capable of providing simultaneous production of a transistor and other elements (such as a transistor of another type, a resistor and a capacitor) which simplifies the process steps during manufacture.

According to one aspect of the present invention, there is provided a novel method which comprises the steps of opening ohmic contact portions at a time after forming a semiconductor layer on the entire surface inclusive of such open portions, then selectively introducing impurities by ion implantation into the contact portions of the semiconductor layer and isolated other element regions thereof so as to produce a transistor and other elements, to implement the above-described simultaneous production methods.

Other objects and features of the present invention will become apparent from the following description which will be given with reference to the illustrative accompanying drawings.

BRIEF DESCRIPTION OF THE DRAWINGS

FIGS. 1A-1J illustrate sequential steps of a first embodiment of the present invention for manufacturing a composite device;

FIGS. 2A-2M illustrate sequential steps of a second embodiment of the present invention for manufacturing a composite device.

DESCRIPTION OF THE PREFERRED EMBODIMENTS

Figure 1A:
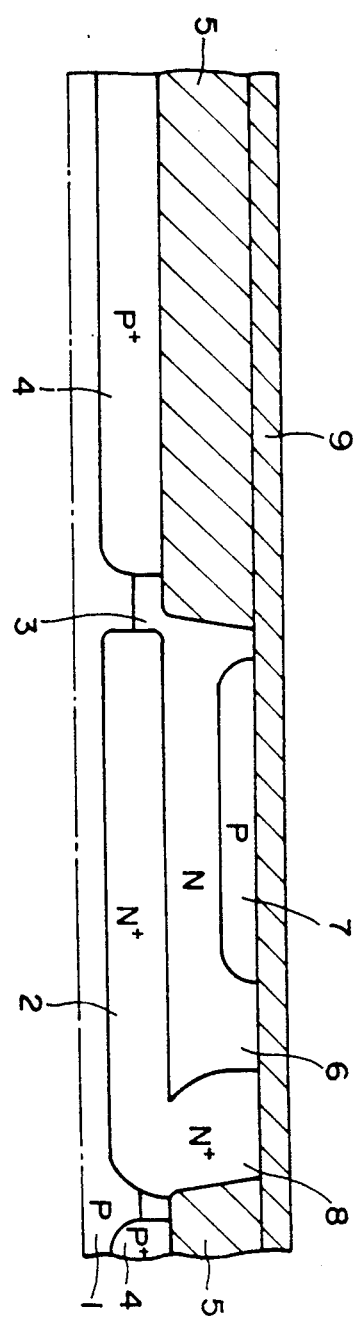
Figure 1B:
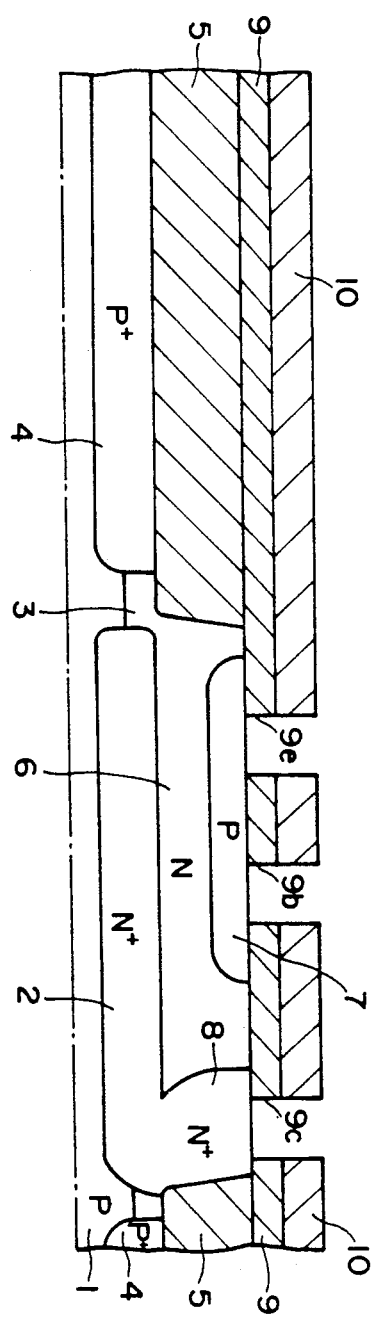
Figure 1C:
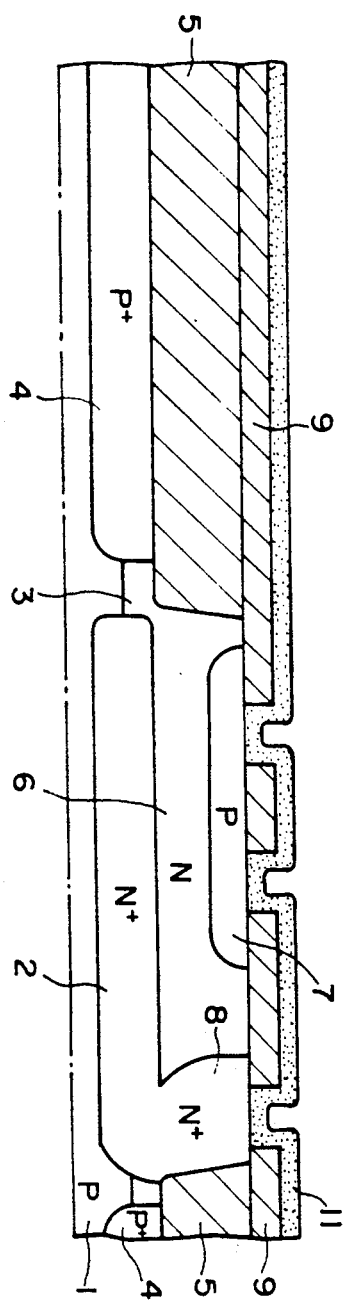
Figure 1J:
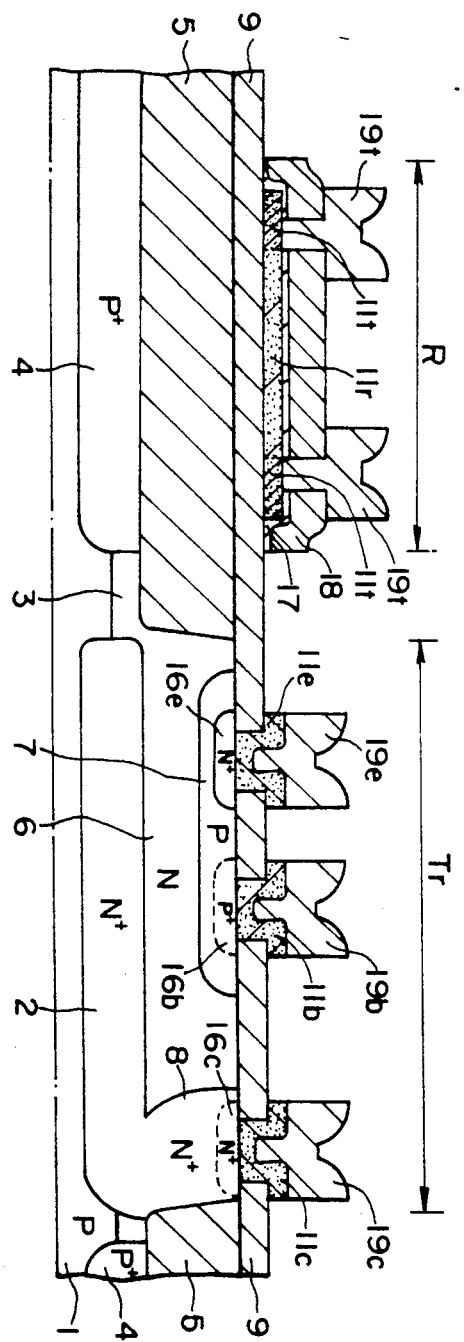
Figure 2A:
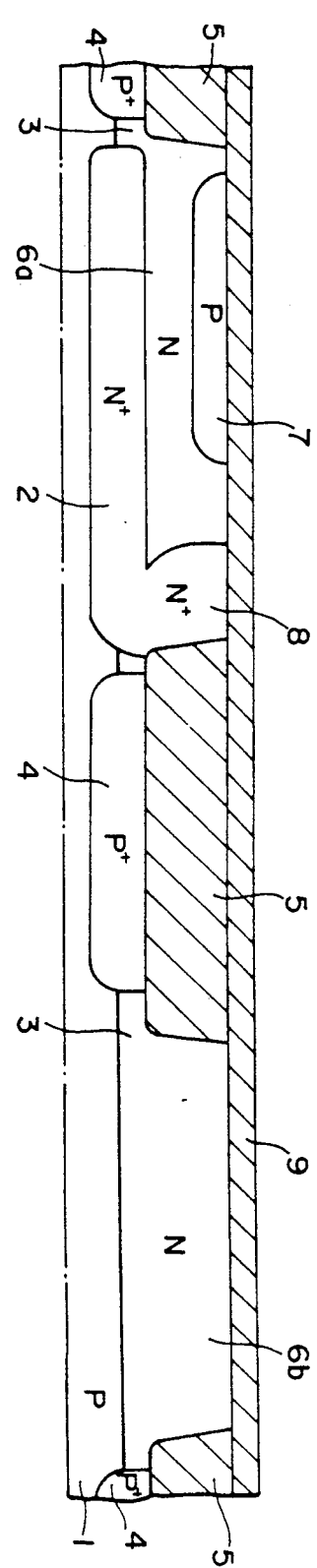
Figure 2B:
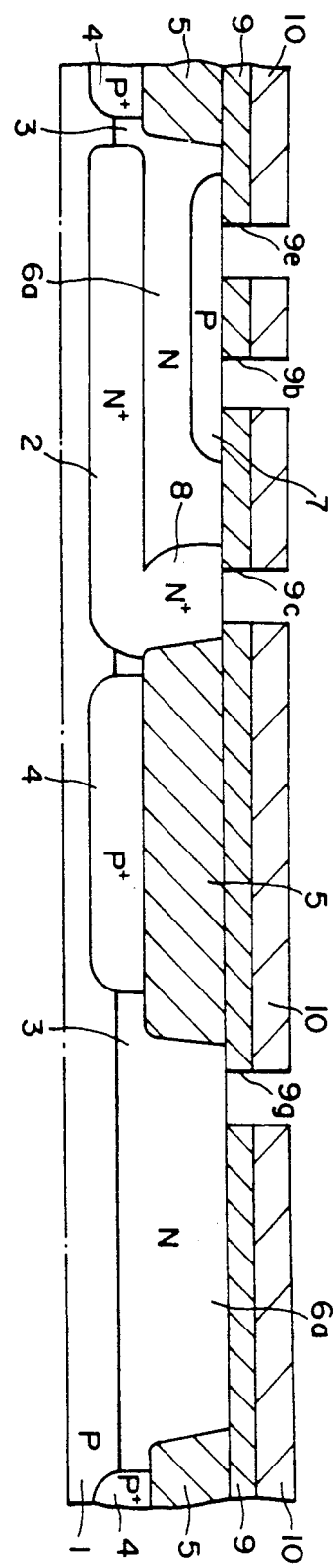
Figure 2C:
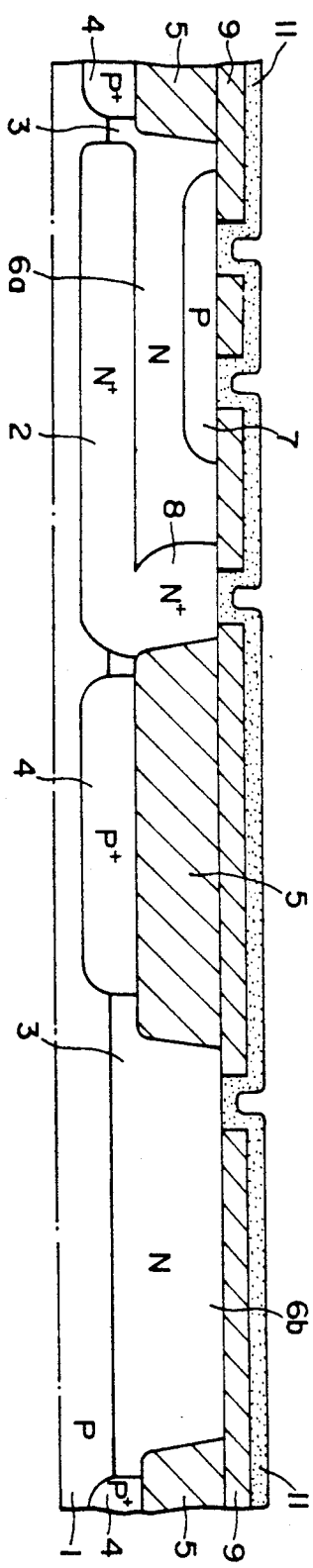
Figure 2G:
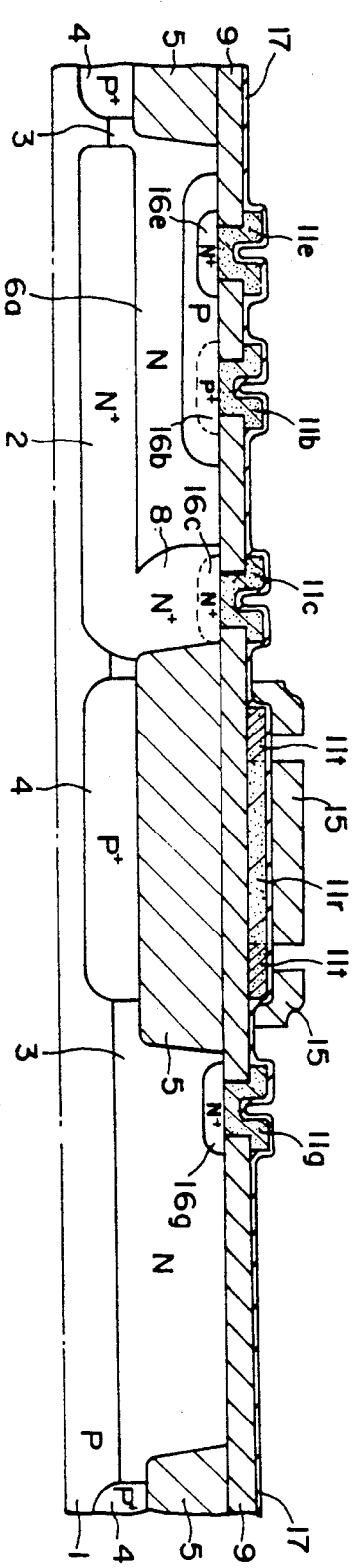
Figure 2H:
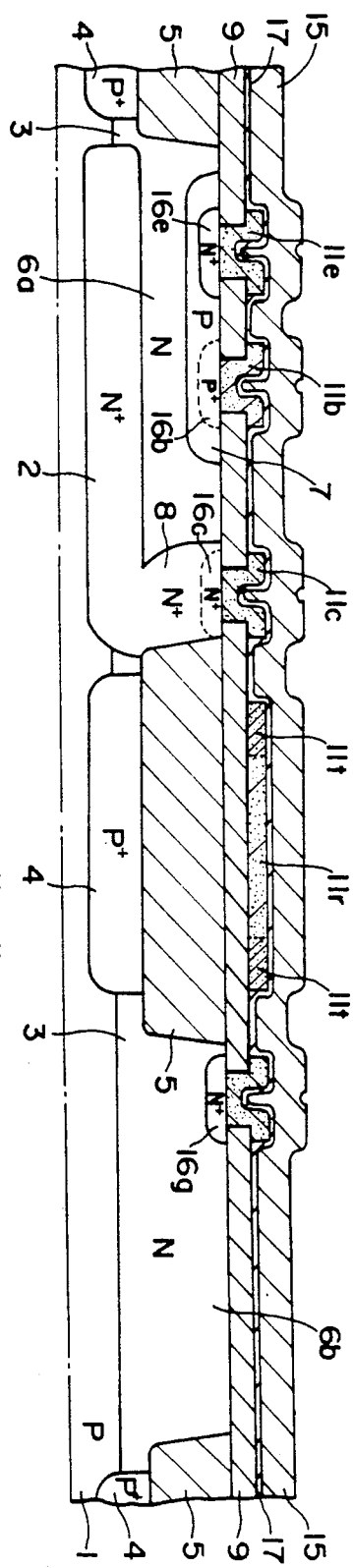
Figure 2I:
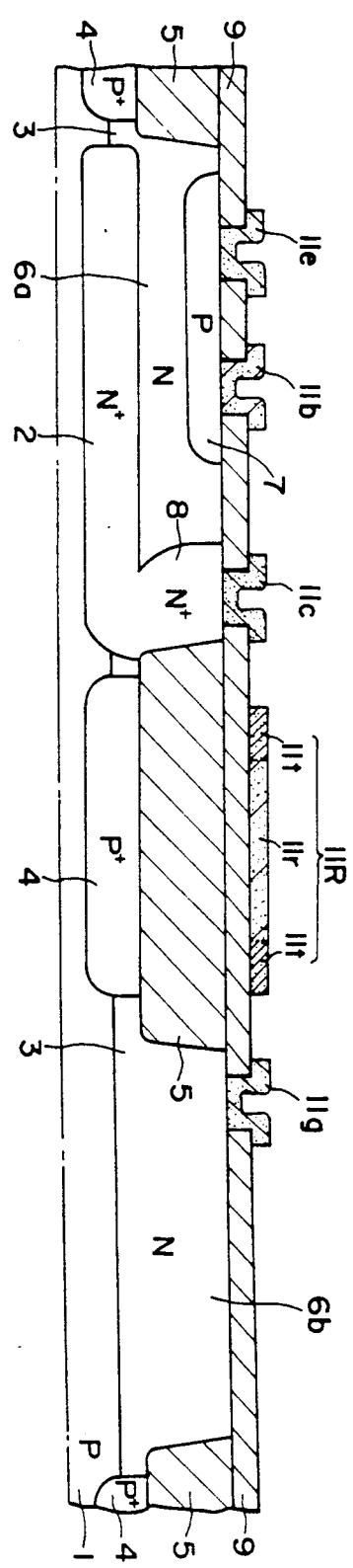
Figure 2M:
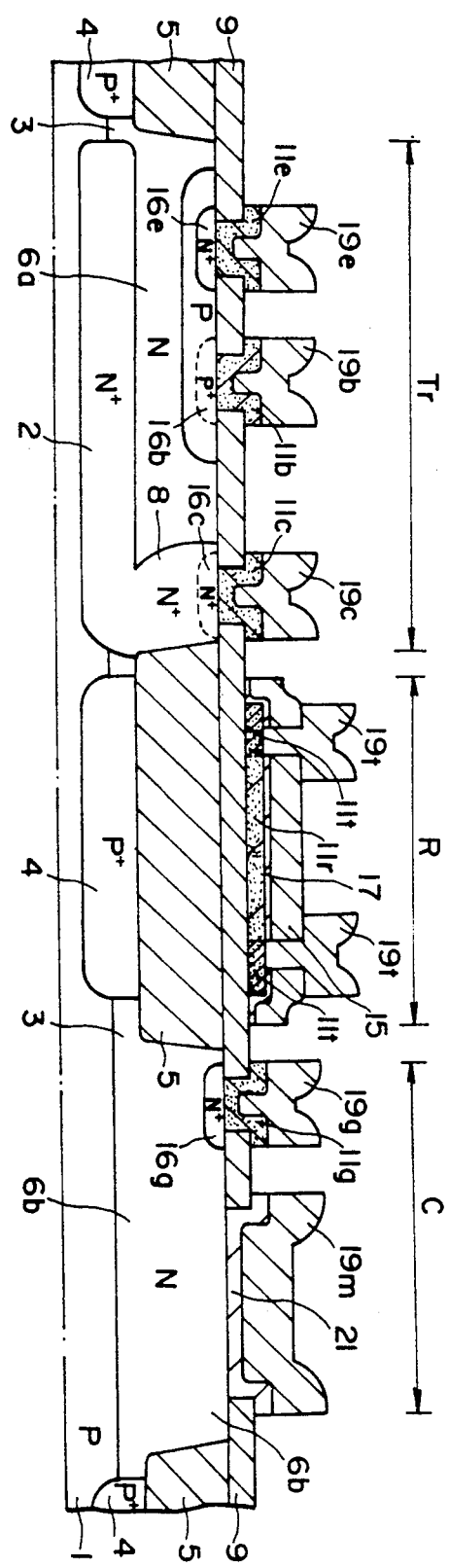
Figure 3A:
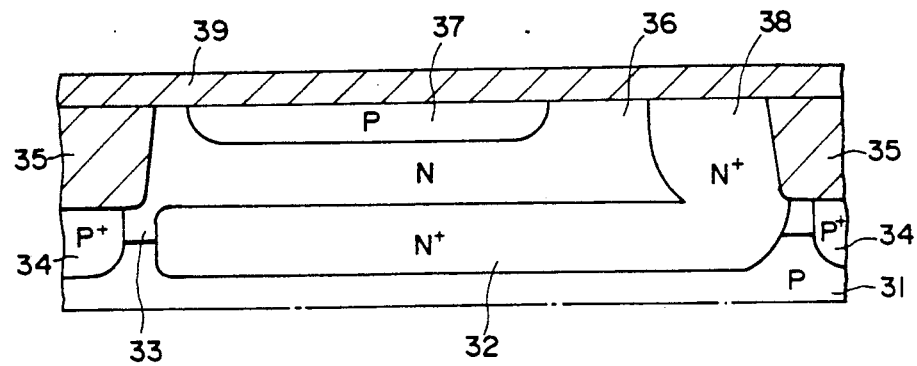
FIGS. 3A-3F illustrate sequential steps of a conventional method for manufacturing a bipolar transistor.
Figure 3B:
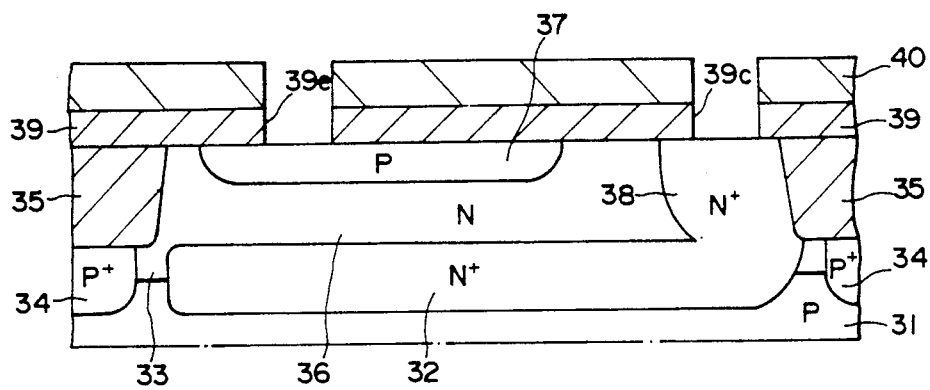
Figure 3C:
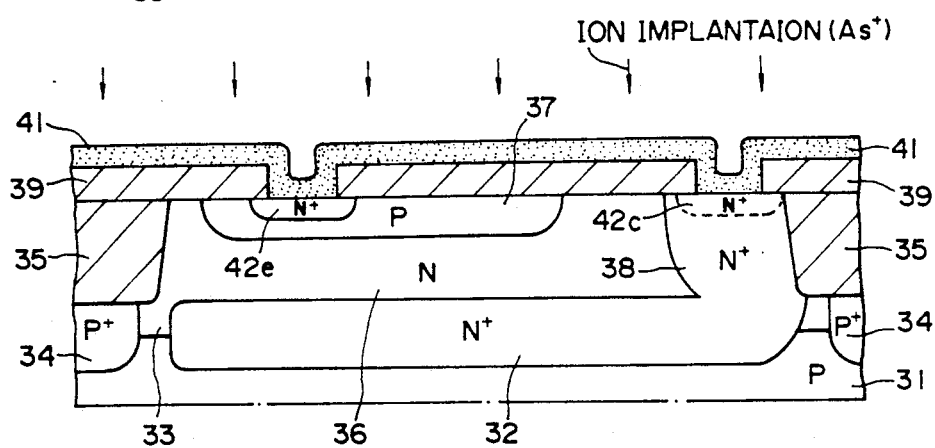
Figure 3D:
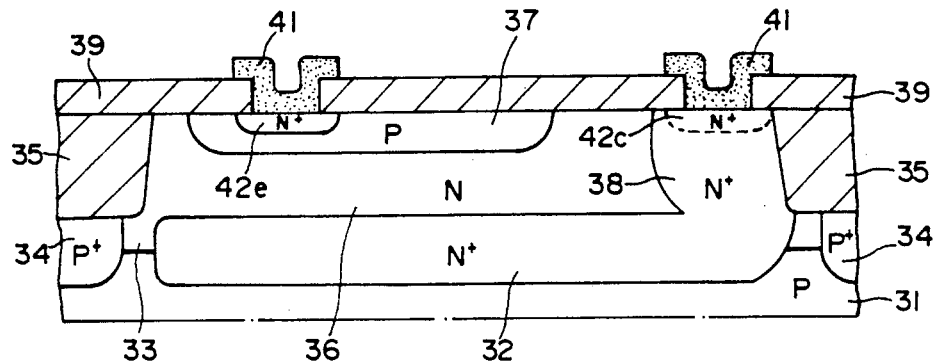
Figure 3E:
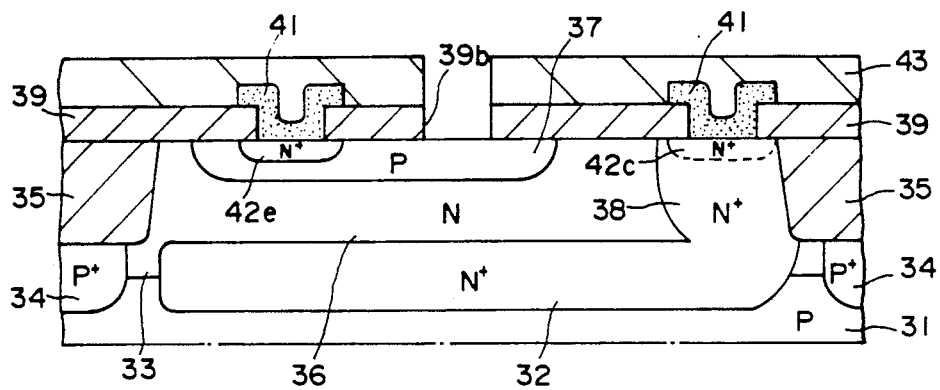
Figure 3F:
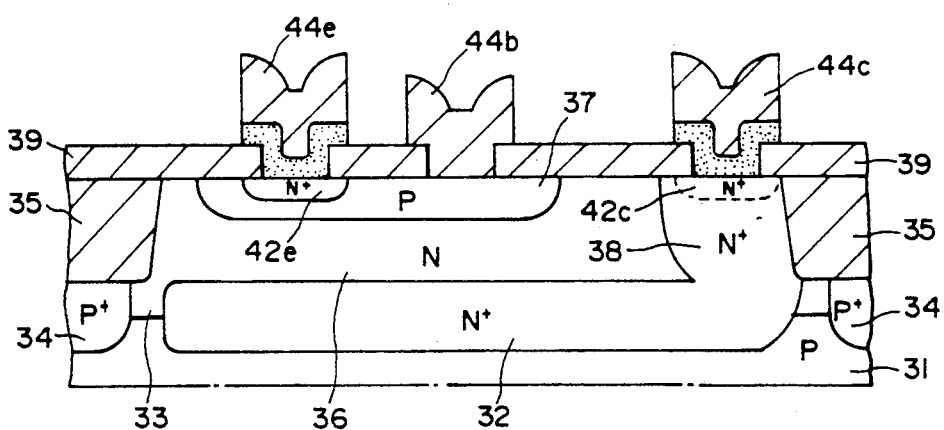

Exemplary embodiments of the present invention will be described with reference to FIGS. 1A-1J and FIGS. 2A-2M.

FIGS. 1A-1J illustrate a first embodiment of the semiconductor device manufacturing method according to the present invention, and in particular, the sequential steps in the method for simultaneously producing an NPN type bipolar transistor of a poly-washed emitter structure and a resistor composed of polycrystal silicon. The individual steps will be sequentially described.

First, as shown in FIG. 1-A, an N-type buried layer 2 and an N-type epitaxial layer 3 are formed on a P-type semiconductor substrate (e.g. silicon substrate) 1, and then a P-type isolated inter-element region 4 and another isolated inter-element region 5 of thick thermal oxide layer (e.g. silicon dioxide layer) are formed. Then a P-type impurity is selectively ion-implanted into an active region 6 which is surrounded by the isolated inter-element regions 4 and 5, to thereby form a base region 7. Simultaneously an N-type impurity is ion-implanted into a portion where a collector contact is to be formed, thereby forming an N-type collector lead region 8 which extends up to the buried layer 2. Then a silicon dioxide layer 9 is formed by CVD (chemical vapor deposition) or the like on the entire surface inclusive of the active region 6.

Subsequently, as shown in FIG. 1-B, a resist mask 10 is formed on the silicon dioxide film 9, and then the film 9 is selectively etched through such resist mask 10 to open, for a time, windows 9e, 9b, 9c, which correspond, respectively, to an emitter region (which serves also as an emitter contact), a base contact and a collector contact in the active region 6a.

In the next step, as shown in FIG. 1-C, the resist mask 10 on the silicon dioxide film 9 is removed therefrom, and a polycrystal silicon layer 11 is formed by CVD or the like on the silicon dioxide film 9 including the windows 9e, 9b, 9c.

Subsequently, as shown in FIG. 1-D, a resist mask 12 is formed on the polycrystal silicon layer 11, and a P-type impurity such as boronic one (e.g. $B^+$, $BF_2^+$) is ion-implanted through a window 12R of the resist mask 12 into a portion 11R which serves as a resistor composed of the polycrystal silicon layer 11.

Then, as shown in FIG. 1-E, the resist mask 12 on the polycrystal silicon layer 11 is removed therefrom, and another resist mask 13 is again formed on the polycrystal silicon layer 11. Thereafter a P-type impurity (e.g. $B^+$, $BF_2^+$) is ion-implanted through the windows 13t, 13b of the resist mask 13 into the resistor contact portion 11t of the polycrystal silicon layer 11 and a portion 11b which corresponds to the base contact and later partially constitutes a base electrode.

Next, as shown in FIG. 1-F, the resist mask 13 on the polycrystal silicon layer 11 is removed therefrom, and a resist mask 14 is again formed on the polycrystal silicon layer 11. Thereafter an N-type impurity (e.g. $As^+$) is ion-implanted through windows 14e, 14c of the resist mask 14 into a portion 11e which corresponds to the emitter region of the polycrystal silicon layer 11 and later partially constitutes an emitter electrode, and a portion 11c which corresponds to the collector contact of the polycrystal silicon layer 11 and later partially constitutes a collector electrode.

Subsequently, as shown in FIG. 1-G, the resist mask 14 on the polycrystal silicon layer 11 is removed therefrom, and then a silicon dioxide film 15 is formed on the polycrystal silicon layer 11 by CVD or the like. The silicon dioxide film 15 functions as a cap film for preventing scattering of the impurity from the polycrystal silicon layer 11 during heat treatment which is to be done during the next step and also for preventing the mutual mixing of impurities of different conduction types. Thereafter a heat treatment is done. In this stage, the N-type impurities from both the portion 11e of the polycrystal silicon layer 11 which corresponds to the emitter region and the portion 11c of the layer 11 which corresponds to the collector contact are diffused into the base region 7 and the collector lead region 8 which exist under such portions respectively, thereby forming an emitter region 16e and a collector contact 16c (shown with a broken line). Simultaneously, the P-type impurity from the portion 11b which corresponds to the base contact of the polycrystal silicon layer 11 is diffused into the base region 7 so as to form a base contact 16b (shown by a broken line).

In the next step, as shown in FIG. 1-H, the cap silicon dioxide film 15 on the polycrystal silicon layer 11 is entirely removed, and then the polycrystal silicon layer 11 is patterned. In this stage, the patterning is performed so as to leave the resistor part 11r, the resistor contact portion 11t, the portion 11e which corresponds to the emitter region 16e, the portion 11b which corresponds to the base contact 16b, and the portion 11c which corresponds to the collector contact 16c.

Subsequently, as shown in FIG. 1-I, a relatively thin $Si_3N_4$ film 17 is formed on the entire surface by decompressed CVD or the like, and then a relatively thick silicon dioxide film 18 is formed on the entire surface. Thereafter the silicon dioxide film 18 is patterned so as to be partially left on the resistor part 11r and the resistor contact portion 11t. In this state, the $Si_3N_4$ film 17 functions as an etching stopper to consequently prevent removal of the silicon dioxide film 9 which exists thereunder.

In the next step, as shown in FIG. 1-J, the $Si_3N_4$ film 17 is removed by etching with hot phosphoric acid or the like in a manner such that the portion which is under the silicon dioxide layer 18 is left. Thereafter an aluminum layer is formed on the entire surface and it is then patterned so as to form a pair of resistor electrodes 19t, an emitter electrode 19e, a base electrode 19b and a collector electrode 19c, thereby producing a composite device which comprises a bipolar transistor Tr of a poly-washed emitter structure and a resistor R.

A second embodiment of the present invention for simultaneously producing the above described composite device and a MIS capacitor will be described with reference to FIGS. 2A–2M which illustrate the sequential steps of the process. In FIGS. 2A–2M, the same components as those used in the first embodiment shown in FIG. 1A–1J are denoted by the same reference numerals and symbols.

First, as shown in FIG. 2-A, an N-type buried layer 2, an N-type epitaxial layer 3, isolated inter-element regions 4 and 5, a P-type base region 7 and an N-type collector lead region are formed on a P-type silicon substrate 1. Thereafter a silicon dioxide film 9 is formed by CVD or the like on the entire surface inclusive of the active regions 6a and 6b.

In the next step, as shown in FIG. 2-B, a resist mask 10 is formed on the silicon dioxide film 9, and then the film 9 is selectively etched through the resist mask 10 to open, for a time, windows 9e, 9b, 9c, 9g in the portions which correspond, respectively, to an emitter region (which also serves as an emitter contact), a base contact and a collector contact in the active region 6a, and one electrode lead region of the MIS capacitor in the active region 6b.

Thereafter, as shown in FIG. 2-C, the resist mask 10 on the silicon dioxide film 9 is removed therefrom, and a polycrystal silicon layer 11 is formed by CVD or the like on the silicon dioxide film 9 including the windows 9e, 9b, 9c, 9g.

In the next step, as shown in FIG. 2-D, a resist mask 12 is formed on the polycrystal silicon layer 11, and a P-type impurity such as boronic one (e.g. B+, BF$_2$+) is ion-implanted through a window 12R of the resist mask 12 into a portion 11R which serves as a resistor composed of the polycrystal silicon layer 11.

Then, as shown in FIG. 2-E, the resist mask 12 on the polycrystal silicon layer 11 is removed therefrom, and another resist mask 13 is again formed on the polycrystal silicon layer 11. Thereafter a P-type impurity (e.g. B+, BF$_2$+) is ion-implanted through the windows 13t, 13b of the resist mask 13 into the resistor contact portion 11t of the polycrystal silicon layer 11 and a portion 11b which corresponds to the base contact.

Next, as shown in FIG. 2-F, the resist mask 13 on the polycrystal silicon layer 11 is removed therefrom, and a resist mask 14 is again formed on the polycrystal silicon layer 11. Thereafter an N-type impurity (e.g. As+) is ion-implanted through windows 14e, 14c, 14g of the resist mask 14 into a portion 11e of the polycrystal silicon layer 11 which corresponds to the emitter region, a portion 11c of the layer 11 which corresponds to the collector contact, and a portion 11g of the layer 11 which corresponds to one electrode lead region of the MIS capacitor.

Subsequently, as shown in FIG. 2-G, the resist mask 14 on the polycrystal silicon layer 11 is removed therefrom, and then the polycrystal silicon layer 11 is patterned. In this stage, the patterning is performed so as to leave the resistor part 11r, the resistor contact portion 11t, the portion 11e which corresponds to the emitter region, the portion 11b which corresponds to the base contact, the portion 11c which corresponds to the collector contact, and the portion 11g which corresponds to one electrode lead region of the MIS capacitor.

Next, as shown in FIG. 2-H, a relatively thin Si$_{23}$N$_4$ film 17 is formed on the entire surface by decompressed CVD or the like, and then a relatively thick silicon dioxide film 15 is formed on the Si$_3$N$_4$ film 17 by CVD or the like. Similarly to the first embodiment, the silicon dioxide film 15 functions as a cap film. Thereafter heat treatment is done. In this stage, the N-type impurities from the portion 11e of the polycrystal silicon layer 11 which correspond to the emitter region, the portion 11c of the layer 11 which correspond to the collector contact, and the portion 11g of the layer 11 which correspond to one electrode lead region of the MIS capacitor are diffused into the base region 7, the collector lead region 8 and the active region 6b which exist under such portion, respectively, thereby forming an emitter region 16e (which also serves as an emitter contact), a collector contact 16c (shown in a broken line) and one electrode lead region 16g of the MIS capacitor. Simultaneously, the P-type impurity from the portion 11b of the polycrystal silicon layer 11 which corresponds to the base contact is diffused into the base region 7 to consequently form a base contact 16b (shown by broken line).

Next, as shown in FIG. 2-I, the silicon dioxide film 15 is patterned so that the portions thereof on the resistor part 11r and the resistor contact portion 11t are left unremoved. In this stage, the Si$_3$N$_4$ film 17 functions as an etching stopper to prevent the removal of the silicon dioxide film 9 which exists thereunder.

Subsequently, as shown in FIG. 2-J, the Si$_3$N$_4$ film 17 is etched with hot phosphoric acid or the like in a manner such that the portion is left which exists under the silicon dioxide film 15.

In the next step, as shown in FIG. 2-K, a resist mask 20 is formed on the entire surface, and then the silicon dioxide film 9 is selectively etched through the resist mask 20 to open a window 9m which communicates with the active region 6b and determines the capacitance (area) of the MIS capacitor.

Next, as shown in FIG. 2-L, a Si$_3$N$_4$ film 21 which is relatively thicker than the aforementioned Si$_3$N$_4$ film 17 is formed on the entire surface by decompressed CVD or the like, and then it is patterned so that the portion of the Si$_3$N$_4$ film 21 is left which corresponds to the window 9m. The Si$_3$N$_4$ film 21 is used as a dielectric film of the MIS capacitor.

Thereafter, as shown in FIG. 2-M, an aluminum layer is formed on the entire surface and then is patterned so as to form a pair of electrodes 19t of the resistor part 11r, an emitter electrode 19e, a base electrode 19b, a collector electrode 19c, on electrode 19g of the MIS capacitor, and another electrode 19m of the MIS capacitor, thereby producing a composite device which comprises a bipolar transistor Tr of a poly-washed emitter structure, a resistor R and a MIS capacitor C.

According to this embodiment, as mentioned above, there can be formed at the same time windows 9e, 9b, 9c which correspond to ohmic contacts of a transistor, i.e. an emitter region 16e, a base contact 16b and a collector contact 16c, and also another window 9g which corresponds to an ohmic contact of the MIS capacitor, i.e. one electrode lead region 16g of the MIS capacitor (as shown in FIGS. 1-B and 2-B). After a polycrystal silicon layer 11 is formed on the entire surface including the windows 9e, 9b, 9c, 9g which correspond to such ohmic contacts, P-type and N-type impurities are selectively introduced by ion implantation into the portions 11e, 11b, 11c, 11g of the polycrystal silicon layer 11 which correspond to the ohmic contacts and the isolated other element region 11R, whereby the resistor R and the MIS capacitor C can be produced simultaneously with the bipolar transistor Tr. Furthermore, since only a single resist mask (denoted by 10) is required for forming the windows 9e, 9b,9c, 9g which correspond to the ohmic contacts, the steps of forming the ohmic contacts are simplified. Particularly in the case of simultaneously producing the MIS capacitor C therewith, the step relating to the capacitor C can be executed in the final stage as shown in FIG. 2-L, so that any harmful influences resulting from heat treatment and so forth (shown in FIG. 2-H) are prevented (that is, the dielectric constant of the $Si_3N_4$ film 21 which serves as a dielectric film is not affected), thus producing a satisfactory MIS capacitor with high precision of the control of the capacitance.

In addition, as described in connection with the second embodiment where the polycrystal silicon layer 11 is patterned immediately after the step of ion implantation (shown in FIGS. 2-D to 2-F), the cap silicon dioxide film 15 formed thereafter can be patterned without being entirely removed and can therefore be utilized as an interlayer insulator film for the resistor contact portion 11t. Consequently, it becomes possible to eliminate the double operation of once forming the cap silicon dioxide film 15 as in the first embodiment and, after the heat treatment, removing the entire cap silicon dioxide film 15, then forming a silicon dioxide film 18 again and patterning it to obtain an interlayer insulator film for the resistor contact portion 11t.

With regard to the step of ion implantation also, an advantage is obtained in that, since the ion implantation is executed into the substrate where the element regions and the windows corresponding to the entire ohmic contacts relative to the elements are previously formed, the ion implantation for the individual conduction types as a whole ranges from a minimum of twice (once for P-type and once for N-type) to a maximum of four times (twice for P-type and twice for N-type), so that the steps of ion implantation can be simplified. In this embodiment, the ion implantation is repeated only a total of three times (twice for P-type and once for N-type).

Also, the polycrystal silicon layer 11 can be used to obtain both a polycrystal silicon layer which is used for forming the resistor part 11r, the resistor contact portion 11t and the portion 1g corresponding to one electrode lead region 16g of the MIS capacitor, and another polycrystal silicon layer which is used for forming the contacts to the diffused regions 16e, 16b, 16c of the bipolar transistor Tr. Therefore, the entire contact portions can be formed out of the single polycrystal silicon layer 11 during one patterning step, hence simplifying the process for shaping the contact portions.

The first embodiment relates to the simultaneous production of an NPN-type bipolar transistor Tr and a resistor R; while the second embodiment relates to the simultaneous production of an NPN-type bipolar transistor Tr, a resistor R and a MIS capacitor C. However, a PNP-type bipolar transistor may be produced in place of the above NPN-type bipolar transistor, or a MOS transistor may be produced as well. Furthermore, it is also possible to simultaneously produce a bi-MOS transistor or a bi-CMOS transistor with a resistor and a MIS capacitor.

According to the semiconductor device manufacturing method of the present invention, windows corresponding to ohmic contacts are opened at the same time and, after a semiconductor layer is formed on the entire surface including such open windows, impurities are selectively introduced by ion implantation into the portions of the semiconductor layer which corresponds to the contacts and the isolated other element region to produce a transistor and other elements. Consequently, simultaneous production of a transistor and other elements (e.g. resistor and capacitor) is realized with a simplified process of manufacture.

Although the invention has been described with respect to preferred embodiments, it is not to be so limited as changes and modifications can be made which are within the full intended scope of the invention as defined by the appended claims.

I claim as my invention:

1. A method of manufacturing a transistor and at least one other device comprising the steps of forming N and P regions in a substrate, forming an insulating film (9) on the surface of said substrate, forming a resist mask (10) on said insulating film (9), selectively etching said insulating film (9) through said resist mask (10) to form a plurality of windows (9a, 9b, 9c) to said substrate, removing said resist mask (10), forming a polycrystalline layer (11) on said insulating film (9) and in said plurality of windows (9a, 9b, 9c), forming a resist mask (12) on said polycrystalline layer (11), ion-implanting a P-type impurity through a window (12R) of the resist mask (12) into a portion (11R) which will be a resistor of said polycrystalline layer (11), removing said resist mask (12), forming another resist mask (13) on said polycrystalline layer (11), ion-implanting through windows (13e 13b) of said resist mask (13) to form resistor contact portions (11e) and a base contact portion (11b) which will correspond to the base in said polycrystalline layer (11), removing said resist mask (13), forming another resist mask (14) on said polycrystalline layer (11), ion-implanting through windows (14e, 14c) of said resist mask (14) to form emitter and collector electrodes, removing said another resist mask (14), forming an insulating film (15) on said polycrystalline layer (11), heat treating said substrate structure and diffusing N-type from portion (11b) of said polycrystalline layer (11) which corresponds to the emitter region (16e) and from portion (11c) of polycrystalline layer (11) which corresponds to the collector contact into the base region (7) and the collector lead region 8 to form an emitter region (16e) and a collector contact (16c) and simultaneously diffusing the P-type impurity from portion (11b) which corresponds to the base contact of polycrystalline layer (11) into the base region (7) to form a base contact 16(b), removing said insulating film (15), forming patterns in said polycrystalline film (11) to leave the resistor part (11r), the resistor contact (11e) the portion (11e) which corresponds to the emitter region (16e), the portion (11b) which corresponds to the base contact (16b) and the portion (11c) which corresponds to the collector contact 916c) forming a thin film (17) on the surface of the semiconductor device forming a relatively thick insulating film (18) on said thinfilm (17), patterning said insulating film (18) so that is partially left on the resistor part (11r) and the resistor contact portion (11e), removing said thin film (17) except those portions under said insulating film (18), and forming resistor electrodes (19e) an emitter electrode (19c), a base electrode (19b) and a collector electrode (19c).

2. A method of manufacturing a transistor and at least two other devices comprising the steps of forming N and P regions on a substrate, forming an insulating film 9 on the surface of said substrate, forming a resist mask (10) on said insulating film (9), selectively etching said insulating film (9) through said resist mask (10) to form a plurality of windows (9a, 9b, 9c, 9g) to said substrate, removing said resist mask (10), forming a polycrystalline layer (11) on said insulating film (9) and in said plurality of windows (9e, 9b, 9c, 9b), forming a resist mask (12) on said polycrystalline layer (11), ion-implanting a P-type impurity through a window (12R) of the resist mask (12) into a portion (11R) which will be a resistor of said polycrystalline layer (11), removing said resist mask (12), forming another resist mask (13) on said polycrystalline layer (11), ion-implanting through windows (13f, 13b) of said resist mask (13) to form resistor contact portions (11t) and a base contact portion (11b) which will correspond to the base in said polycrystalline layer (11), removing said resist mask (13), forming another resist mask (14) on said polycrystalline layer (11), ion-implanting through windows (14e, 14c, 14g) of said resist mask (14) into a portion (11c) of polycrystalline layer (11) corresponding to the emitter region and the collector electrode and a portion (11g) of a lead of a capacitor, removing said another resist mask (14), patterning said polycrystalline layer (11) to leave resistor part (11r), resistor contact (11t), the emitter region, the base contact, the collector contact and one lead (11g) of the capacitor, forming a thin film (17) on said substrate structure, forming another insulating film on said thin film (17), heat treating said substrate structure and diffusing N-type from portion (11e) of said polycrystalline layer (11) which corresponds to the emitter region and from portion (11c) of polycrystalline layer (11) which corresponds to the collector contact, a portion (11g) corresponding to one capacitor lead into the base region (7) and the active region (6b) to form an emitter region (16e) and a collector contact (16c) and one lead of said capacitor and simultaneously diffusing the P-type ipurity from portion (11b) which corresponds to the base contact of polycrystalline layer (11) into the base region (7) to form a base contact 16(b), patterning said insulating film (15) to leave the resistor part (11r), the resistor contact (11f), patterning said thin film (17) so that the portion under insulating film (15) remains, forming another resist mask (20) on said substrate device, selectively etching said insulating film (9) to open a window (9m) which communicates with the active region (6b) and determines the capacitance of said capacitor, forming a film (21) on said substrate device, patterning said film (21) so that the portion of film (17) is left which corresponds to window (9m) and forming electrodes (19t) for said resistor (11r) an emitter electrode (19e), a base electrode (19g), a collector electrode (19c), a capacitor electrode (19g) and a capacitor electrode (19m).

* * * * *